United States Patent
Nagano et al.

(10) Patent No.: US 11,366,138 B2
(45) Date of Patent: *Jun. 21, 2022

(54) CORE FOR ELECTRIC CURRENT DETECTOR AND METHOD FOR MANUFACTURING THE SAME

(71) Applicant: SHT Corporation Limited, Izumisano (JP)

(72) Inventors: Ai Nagano, Izumisano (JP); Nobuhiro Kitai, Izumisano (JP)

(73) Assignee: SHT CORPORATION LIMITED, Osaka (JP)

( * ) Notice: Subject to any disclaimer, the term of this patent is extended or adjusted under 35 U.S.C. 154(b) by 333 days.

This patent is subject to a terminal disclaimer.

(21) Appl. No.: 16/599,469

(22) Filed: Oct. 11, 2019

(65) Prior Publication Data

US 2020/0116761 A1  Apr. 16, 2020

(30) Foreign Application Priority Data

Oct. 16, 2018  (JP) .............................. JP2018-195126

(51) Int. Cl.
  *G01R 15/18*  (2006.01)
  *G01R 19/00*  (2006.01)
  (Continued)

(52) U.S. Cl.
  CPC ....... *G01R 15/183* (2013.01); *G01R 19/0092* (2013.01); *H02K 3/47* (2013.01); *H02K 3/50* (2013.01); *H02K 3/522* (2013.01)

(58) Field of Classification Search
  CPC .............. G01R 15/183; G01R 19/0092; G01R 15/207; H02K 3/50; H02K 3/47;
  (Continued)

(56) References Cited

U.S. PATENT DOCUMENTS

| 6,246,172 B1 * | 6/2001 | Bizen | H01F 41/0226 315/5.41 |
| 2010/0090685 A1 * | 4/2010 | Andrieu | G01R 15/207 324/117 R |

FOREIGN PATENT DOCUMENTS

| JP | 2007-88019 A | 4/2007 |
| JP | 2013120106 A | * 6/2013 |
| JP | 2018056343 A | * 4/2018 ........... H01F 27/022 |

OTHER PUBLICATIONS

English translation for JP-2013120106-A (Year: 2013).*
English translation for JP-2018056343-A (Year: 2018).*

* cited by examiner

*Primary Examiner* — Douglas X Rodriguez
*Assistant Examiner* — Byung Ro Lee
(74) *Attorney, Agent, or Firm* — Eckert Seamans Cherin & Mellott, LLC

(57) ABSTRACT

A core for an electric current detector comprises a pair of first and second core pieces (20), (23), wherein the first core piece has first opposed surfaces (21), (21) and the second core piece has second opposed surfaces (24), (24), the first and second opposed surfaces face to each other with a spacing between a first gap (26) and a second gap (28), respectively, and the first and second core pieces are covered by a resin-made first partial mold (30) on the area near and inclusive of the first gap and are covered by a resin-made second partial mold (40) on the area near and not inclusive of the second gap, wherein the second partial mold includes a second-1 molded member (41) on the first core piece side and a second-2 molded member (42) on the second core piece side.

4 Claims, 3 Drawing Sheets

(51) Int. Cl.
*H02K 3/47* (2006.01)
*H02K 3/50* (2006.01)
*H02K 3/52* (2006.01)

(58) Field of Classification Search
CPC .......... H02K 3/522; H01F 3/04; H01F 38/00; H01F 27/24; H01F 27/25; H01F 27/263; H01F 41/0206; H01F 41/022
USPC ....................................................... 324/127
See application file for complete search history.

CORE FOR ELECTRIC CURRENT DETECTOR AND METHOD FOR MANUFACTURING THE SAME

BACKGROUND OF THE INVENTION

1. Field of the Invention

The present invention relates to a core for an electric current detector and a method for manufacturing the same. More specifically, the present invention relates to a core in which a plurality of gaps are formed in a core main body, and a method for manufacturing the same.

2. Description of Related Art

An electric current detector having a configuration in which a busbar is arranged on the inner peripheral side of a core produced by forming a gap in an annular core main body made of a magnetic material, and a magnetism detecting element is arranged in the gap is known (see JP 2007-88019A, for example).

SUMMARY OF THE INVENTION

A core in which a plurality of gaps are provided in a core main body is also proposed in order to improve the magnetic characteristics and adjust the magnetic saturation characteristics. For example, in the case of a core main body in which two gaps are formed, a magnetism detecting element is arranged in one gap, and the other gap acts to stabilize the magnetic saturation characteristics.

In the case where a single gap is formed, even after the gap has been formed by cutting an annular core main body, a core is still constituted by a single member having a substantially C shape, whereas in the case where two gaps are formed, two core pieces are formed from the core main body and come apart.

In particular, when a so-called wound core obtained by winding a belt-shaped steel plate is employed as a core main body, the position at which the winding of the steel plate is started and the position at which the winding of the steel plate is finished differ from each other in the core main body. Moreover, particularly in the case of the wound cores, if the winding strength of the steel plate varies, even the core main bodies that are wound the same number of times may vary in the cross-sectional area. Furthermore, the wound cores are annealed after the steel plates have been wound, and the residual stress due to the winding step, the annealing step, the varnish impregnation step, and the like is present in the wound core. Therefore, when the core main body is cut, the resulting core pieces may also loosen due to the restoring force of the wound belt-shaped steel plate. Accordingly, if a core is produced using core pieces that vary in the cross-sectional area or in the degree of looseness, there is a risk that the portions of the core pieces that are opposed to each other with the gap being interposed therebetween will vary in the area, the magnetic permeability will thus decrease, the desired magnetic characteristics or magnetic saturation characteristics cannot be obtained, and the linearity or error rate that indicates an error from an ideal B-H in the linear region, which is an index of the linearity, will be affected. In addition, if the positions at which the gaps are formed are not located at the center of the core main body, asymmetric core pieces will be obtained as a result of cutting the core main body to form the gaps. Therefore, the paring, that is, a proper combination of two core pieces, is important.

Accordingly, after cutting the core main bodies, it is necessary to avoid the pairing of core pieces produced from different core main bodies and use a combination of core pieces obtained from the same core main body. However, while core pieces are manufactured by cutting core main bodies and incorporated into electric current detectors, it is difficult and complicated to maintain the pair of core pieces obtained from the same core main body.

It is an object of the present invention to provide a core for an electric current detector in which a plurality of gaps can be formed while the paring of core pieces is maintained, and a method for manufacturing the same.

A core for an electric current detector according to the present invention is a core for an electric current detector, including:

a pair of core pieces formed by cutting an annular core main body in a radial direction at two positions, the core pieces being arranged such that cross-sectional surfaces thereof are opposed to each other with a first gap and a second gap being interposed therebetween;

a first partial molding that is made of resin and continuously covers the cross-sectional surfaces of the core pieces opposed to each other with the first gap being interposed therebetween and a peripheral surface including the first gap; and a second partial molding that is made of resin and covers portions of peripheral surfaces of the cross-sectional surfaces of the core pieces opposed to each other with the second gap being interposed therebetween, the second partial molding including a second-1 molded member that covers a peripheral surface of one of the cross-sectional surfaces of the core pieces opposed to each other with the second gap being interposed therebetween, and a second-2 molded member that covers a peripheral surface of the other of the cross-sectional surfaces of the core pieces.

It is desirable that the second-1 molded member and the second-2 molded member are connected via a bridge portion made of the resin.

The bridge portion can be formed on the inner peripheral side with respect to the second gap.

A configuration is also possible in which the second-1 molded member and the second-2 molded member are separated.

It is desirable that a non-magnetic spacer is inserted into the first gap.

An electric current detector is obtained by arranging a magnetism detecting element in the second gap of the above-described core for an electric current detector, and inserting a busbar into the center of the core main body.

A method for manufacturing a core for an electronic current detector of the present invention is a method for manufacturing a core for an electric current detector, including:

a step of preparing an annular core main body;

a first gap forming step of forming a first gap in the core main body by cutting the core main body in a radial direction, cross-sectional surfaces being opposed to each other with the first gap being interposed therebetween;

a first partial molding forming step of continuously covering, with resin, the cross-sectional surfaces opposed to each other with the first gap being interposed therebetween, and a peripheral surface including the first gap;

a second partial molding forming step of forming a second partial molding by covering, with resin, a portion of the core main body located at a position that is different from the position of the first partial molding; and a second gap forming step of forming a second gap in the core main body by cutting the second partial molding and the core main body in a radial direction at the position at which the second partial molding is formed.

It is desirable that the second gap forming step is performed such that the second partial molding is not completely cut and a bridge portion made of the resin serving as a connection portion is left over.

The method for manufacturing a core for an electric current detector can include a spacer inserting step of inserting a non-magnetic spacer into the first gap, the step being performed after the first gap forming step and before the first partial molding forming step.

With the core for an electric current detector according to the present invention, the first gap is formed in the core by cutting the core main body. As a result, the core main body has a substantially C shape provided with one gap. The first partial molding is formed to cover the first gap, and thus the core main body has an annular shape again. Then, the second gap is formed by cutting the core main body at a position at which the second partial molding is formed. The core main body is divided into two core pieces, but since the core pieces are connected via the first partial molding, the core pieces do not come apart and the pair is maintained even when the second gap is formed. Accordingly, incorporating the core into an electric current detector in this state makes it possible to maintain the pair of the core pieces formed from the same core main body. Therefore, even when a wound core obtained by winding a belt-shaped steel plate is used as the core, it is possible to avoid the pairing of core pieces produced from different core main bodies and use a combination of core pieces obtained from the same core main body after the first gap and the second gap have been formed. Accordingly, the cross-sectional surfaces that are opposed to each other with the gap being interposed therebetween have substantially the same area, and the degrees of looseness of the core pieces due to the restoring force of the belt-shaped steel plates are also substantially the same. This makes it possible to prevent a decrease in magnetic permeability, thus making it possible to achieve stable magnetic characteristics or magnetic saturation characteristics as well as the desired linearity or error rate. Even in the case of a core main body in which gaps are formed at asymmetric positions, such paring can be ensured.

With the core for an electric current detector according to the present invention, the space in the second gap can be maintained by providing the bridge portion spanning the second gap, thus making it possible to eliminate the need to adjust the gaps and the like when incorporating the core into an electric current detector.

Resin is not molded around the entire core main body but is molded around portions of the core main body, and therefore, stress applied from the moldings to the core due to thermal expansion during molding of resin through insert molding or the like and during use of the core can be reduced, thus making it possible to stabilize the magnetic characteristics.

A magnetism detecting element can be arranged in one of the gaps formed in the core, and the other can be used to prevent magnetic saturation. In this case, it is desirable to arrange a magnetism detecting element in the second gap in which no resin exists.

It should be noted that it is also possible to form the first partial molding in the state in which a magnetism detecting element is inserted into the first gap after the first gap has been formed. A configuration is also possible in which a high-current magnetism detecting element and a low-current magnetism detecting element are arranged in the first gap and the second gap, respectively, to detect a high electrical current and a low electrical current. Also, the redundancy may be achieved by arranging the same or equivalent magnetism detecting elements in the first gap and the second gap in preparation for the occurrence of a problem in one magnetism detecting element.

There is a risk that the size of the space in the first gap will change due to thermal expansion of the resin. However, to address this, a non-magnetic spacer that is desirably made of a material with a low thermal expansion coefficient need only be inserted into the first gap before the first molding is formed.

With the method for manufacturing a core for an electric current detector of the present invention, after the first gap has been formed, the core main body is provided with the first partial molding and the second partial molding at positions at which the first gap has been formed and the second gap is to be formed. The core main body is divided by the first gap, but the first partial molding made of resin spans the first gap, and therefore, the shape of the core main body is restored to an annular shape before the second gap is formed. Accordingly, even when the second gap is formed at the position at which the second partial molding has been provided in the subsequent step, the C shape of the core main body is maintained, and therefore, the core pieces do not come apart after the gaps have been formed. Accordingly, as mentioned above, the pair of the core pieces do not come apart, and in addition, the spaces in the gaps can also be maintained.

DETAILED DESCRIPTION OF THE INVENTION

Hereinafter, a core 10 according to an embodiment of the present invention will be described with reference to the drawings.

Figure 1:
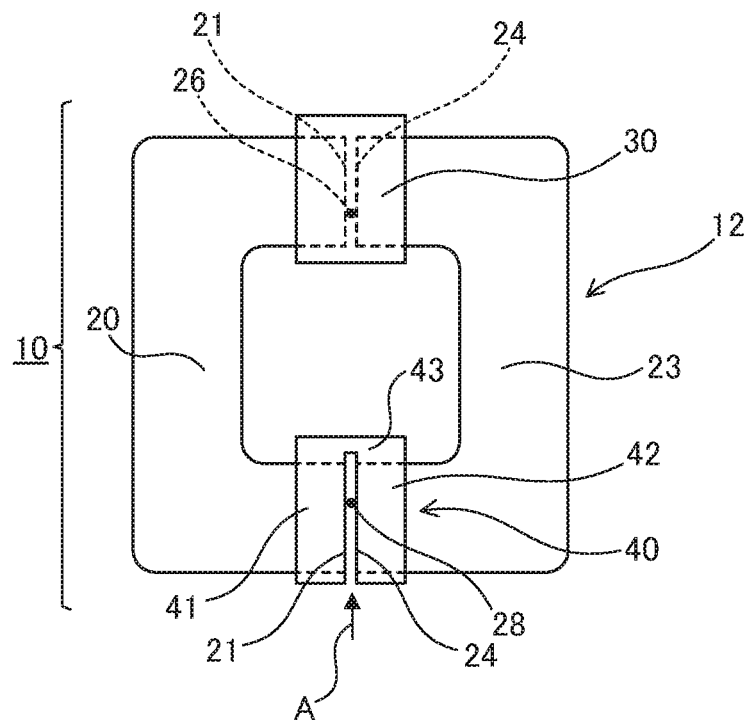
FIG. 1 is a plan view of a core according to an embodiment of the present invention.

FIG. 1 is a plan view of the core 10 according to an embodiment of the present invention. The core 10 includes core pieces 20 and 23 obtained by cutting an annular core main body 12 at two positions, and has a configuration in which the core pieces 20 and 23 are arranged such that cross-sectional surfaces 21 and 24 of the core pieces 20 and 23 are opposed to each other so as to form a first gap 26 and a second gap 28 therebetween. The core pieces 20 and 23 are provided with partial moldings 30 and 40 that are made of resin and cover portions of the peripheral surfaces (outer peripheral surfaces) of the cross-sectional surfaces 21 and 24 opposed to each other with the gaps 26 and 28 being interposed therebetween. Hereinafter, the two partial moldings are referred to as a first partial molding 30 and a second partial molding 40 as appropriate. Although the gaps 26 and 28 are formed at two positions in the embodiment shown in the diagram, two or more gaps may also be formed if a plurality of gaps are to be formed.

As shown in FIG. 1, the first partial molding 30 is formed to fill the first gap 26, and the second partial molding 40 is cut at the position at which the second gap 28 is formed. It should be noted that it is desirable that a portion of the second partial molding 40 for forming a bridge portion 43, which will be described below, is thicker than the remaining portion. This makes it possible to reduce the thickness of the partial molding 40 as a whole while the bridge portion 43 can be reliably left over when the gap 28 is formed by cutting the core main body.

More specifically, in the second partial molding 40, a second-1 molded member 41 that is formed around a cross-sectional surface 21 of the core piece 20, which is one of the core pieces, and a second-2 molded member 42 that is formed around a cross-sectional surface 24 of the core piece 23, which is the other of the core pieces, are connected via the bridge portion 43 such that the core pieces 20 and 23 obtained by dividing the core main body into a plurality of portions do not come apart and the annular form of the core 10 can be maintained.

The core 10 of the present invention can be used as a component of an electric current detector. For example, an electric current sensor is formed by inserting a magnetism detecting element into one or both of the gaps 26 and 28 and inserting a busbar through the central opening. The gap into which no magnetism detecting element is inserted acts as a gap for preventing magnetic saturation, for example. It is convenient, for example, to allow the first gap 26 to function as a gap for preventing magnetic saturation and arrange a magnetism detecting element in the second gap 28 in which no resin exists.

It will be appreciated that it is also possible to form the first partial molding 30 in the state in which a magnetism detecting element is inserted into the first gap 26 after the first gap 26 has been formed. A configuration is also possible in which a high-current magnetism detecting element and a low-current magnetism detecting element are arranged in the first gap 26 and the second gap 28, respectively, to detect a high electrical current and a low electrical current. Also, the redundancy may be achieved by arranging the same or equivalent magnetism detecting elements in the first gap and the second gap in preparation for the occurrence of a problem in one magnetism detecting element. Although the gaps 26 and 28 have the same width in the diagram, a configuration is also possible in which the width of the gap into which a magnetism detecting element is to be inserted is increased, and the width of the gap for preventing magnetic saturation is reduced.

In the present invention, the core pieces 20 and 23 are formed by cutting the annular core main body 12. The core main body 12 can be made of a magnetic material, and examples thereof include a wound core obtained by winding a thin plate made of a magnetic material and annealing the wound thin plate, a laminated core obtained by stacking annular thin plates made of a magnetic material, and a dust core obtained by molding powder made of a magnetic material through compression molding. With the present invention, the pair of the core pieces 20 and 23 can be maintained without mistakes when the core main body 12 is cut, and therefore, the present invention is particularly suitable for a wound core that has been wound a different number of times between at the start of winding of the thin plate around the core main body 12 and at the end of winding the thin plate, and a core in which the gaps 26 and 28 are formed at positions shifted from the center and that includes core pieces 20 and 23 whose shapes are asymmetric.

The partial moldings 30 and 40 are made of an electrical insulating resin, and can be formed around the core main body 12 through insert molding or the like. Examples of the resin include PPS (polyphenylene sulfide resin), PBT (polybutylene terephthalate resin), and PET (polyethylene terephthalate resin). For example, insert molding can be performed by arranging the core main body 12 provided with the first gap 26 in a mold provided with a recess corresponding to the core main body 12 and the partial moldings 30 and 40, injecting molten resin using any of various injection molding machines, and curing the resin. The partial moldings 30 and 40 are provided to cover portions of the core main body 12, that is, cover portions of the outer periphery of the core main body 12. If a molding is formed around the entire core main body 12, stress will be applied to the core main body 12 during insert molding, and stress caused by the difference in the thermal expansion coefficient between the material of the core main body 12 and the resin to be molded will be applied to the core main body 12 after insert molding. Thus, there is a risk that the magnetic characteristics will become unstable. On the other hand, when the partial moldings 30 and 40 are provided around portions of the core main body 12, it is possible to suppress the occurrence of such stress and stabilize the magnetic characteristics of the core main body 12.

Figure 2:
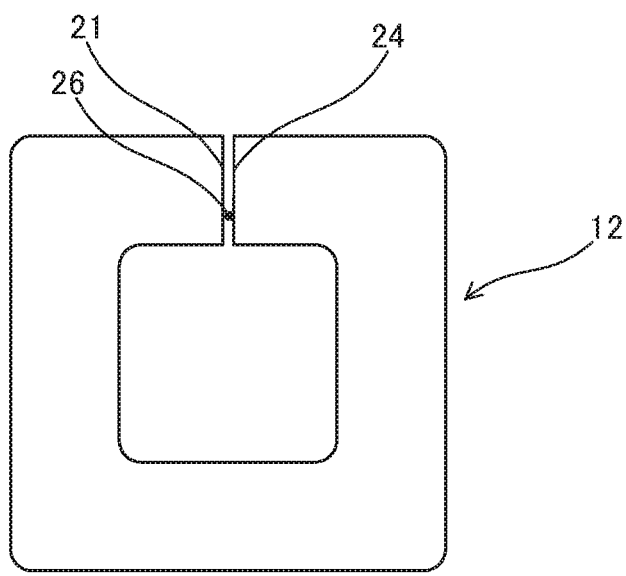
FIG. 2 is a plan view showing a state in which a first gap is formed in a core main body.

The above-mentioned core 10 can be produced according to the following procedure. First, as shown in FIG. 2, the first gap 26 is formed in the core main body 12 using a dicing blade or the like. The formation of the first gap 26 is continued until the core main body 12 is completely cut in the radial direction (first gap forming step).

Figure 3:
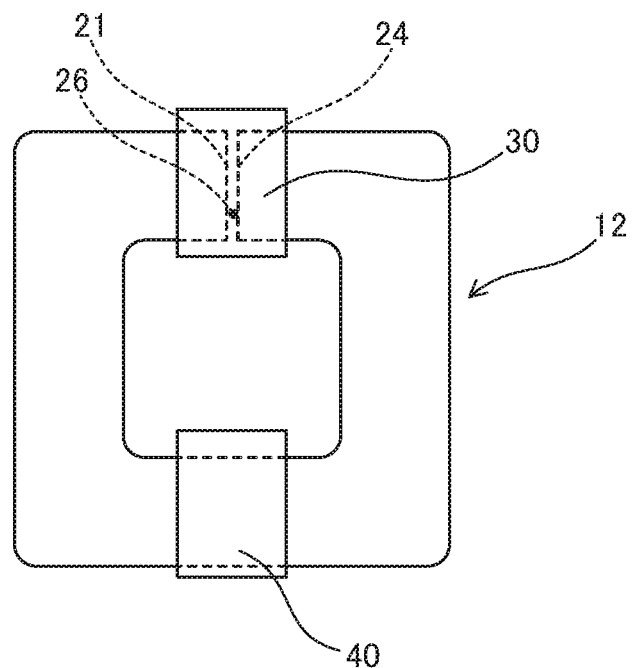
FIG. 3 is a plan view showing a state in which partial moldings are formed around a core main body.

Subsequently, as shown in FIG. 3, the position on the core main body 12 at which the first gap 26 is formed is covered with the first partial molding 30 (first partial molding forming step), and the position on the core main body 12 at which the second gap 28 is to be formed is covered with the second partial molding 40 (second partial molding forming step). These partial molding forming steps may be performed simultaneously, or one of these steps may be performed before or after the other is performed. Although the partial moldings 30 and 40 are formed on the sides of the core main body 12 that are opposed to each other, the partial moldings 30 and 40 can also be formed on the adjacent sides or the same side in accordance with the positions at which the gaps 26 and 28 are formed. If the gaps 26 and 28 are formed at positions shifted from the center of the core main body 12, it is necessary to form the partial moldings 30 and 40 at the corresponding positions.

In the first partial molding forming step, the first gap 26 and the peripheral surfaces of the cross-sectional surfaces 21 and 24 facing the first gap 26 are continuously covered with resin. By not only covering the peripheral surface of the core main body 12 with resin but also injecting resin into the first gap 26, the first gap 26 is filled with the resin, and the core main body 12 thus has an annular shape.

Subsequently, the second gap 28 is formed in the core main body 12 (second gap forming step). The second gap 28 is formed by completely cutting the core main body 12 in the radial direction using a dicing blade or the like at the position at which the second partial molding 40 is formed. At this time, it is desirable that the second partial molding 40 is not completely cut as shown in FIG. 1, and a portion thereof is left over such that the second-1 molded member 41 and the second-2 molded member 42, which are separated from each other with the second gap 28 being interposed therebetween, are connected via the bridge portion 43. For example, when the gap 28 is formed by inserting a dicing blade into the core main body 12 in the radial direction as indicated by arrow A shown in FIG. 1, the core main body 12 can be cut such that the bridge portion 43 is left over on the inner diameter side. When the core main body 12 is cut from a lateral surface side, the bridge portion 43 is left over on the other lateral side. Although the thickness of the uncut bridge portion 43 needs to be taken into consideration depending on the type of resin, it is desirable to secure a thickness of 1 mm or more for PPS, for example. It should be noted that the width of the gap 28 can be adjusted as appropriate by changing the thickness of the dicing blade.

In a specific embodiment, when a dicing blade to be used to cut the core main body 12 and the partial molding 40 has a diameter of about 10 cm to 22.5 cm, wet cutting can be performed under the condition where the rotation number of a grinding stone is set to approximately 2000 rpm. In order to completely cut the core main body 12 and leave the bridge portion 43 over, it is desirable to employ an automatic cutting machine equipped with a traveling table that keeps the level of the core main body 12 and the level of a grinding stone constant at all times.

By forming the second gap 28 in the portion around which the second partial molding 40 is formed in the state in which the first gap 26 of the core main body 12 is filled with the first partial molding 30, the core pieces 20 and 23 do not come apart and the pair of the core pieces 20 and 23, which are obtained from the same core main body, is maintained even when a plurality of gaps, namely the gaps 26 and 28, are formed in the core main body 12.

The second gap 28 is formed in the portion around which the second partial molding 40 has been formed, and therefore, it is possible to make it less likely that swarf of the core main body 12 will remain on the cross-sectional surfaces 21 and 24. In particular, in the case where a wound core is used as the core main body 12, forming the second partial molding 40 makes it possible to prevent metal burr and splinters, which cause conductive foreign matters that are undesirable in electronic components, from occurring on the cross-sectional surfaces 21 and 24 while the second gap 28 is being formed.

In the core 10 of the present invention, the core pieces 20 and 23 are connected due to the first partial molding 30 filling the first gap 26, and the space in the second gap 28 is kept constant due to the bridge portion 43. Therefore, it is unnecessary to adjust the widths of the gaps.

The obtained core 10 can be used as an electric current detector by inserting a busbar into the center of the core 10 and arranging a magnetism detecting element in the second gap 28. The first gap 26 in which no magnetism detecting element is arranged can be used to adjust magnetic saturation. It will be appreciated that magnetism detecting elements may also be arranged in both the gaps 26 and 28 by arranging a magnetism detecting element in the first gap 26 in advance and then forming the first partial molding 30. In this case, using a high-current magnetism detecting element as one of these magnetism detecting elements and a low-current magnetism detecting element as the other is advantageous in that inexpensive magnetism detecting elements that detect a relatively narrow range can be employed instead of expensive magnetism detecting elements that can detect magnetism in a broad range from a low electric current to a high electric current. Also, the same or equivalent magnetism detecting elements can be employed for the gaps 26 and 28. This enables switching of the magnetism detecting elements when a problem occurs. That is, the redundancy of the electric current detector can be achieved. Also, the detection accuracy can be improved by determining the average of outputs from both the magnetism detecting elements.

Figure 4:
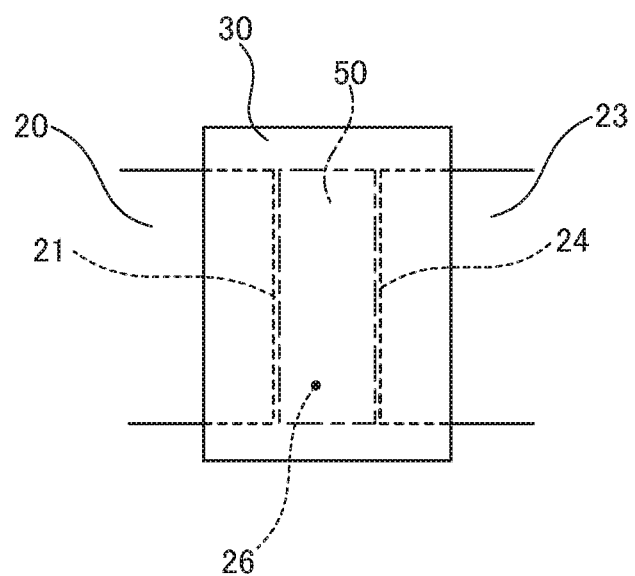
FIG. 4 is an enlarged view of the vicinity of a first partial molding, showing a state in which a non-magnetic spacer is inserted into the first gap.

It should be noted that there is a risk that the spaces in the gaps 26 and 28 will increase or decrease at the operating temperature of the core 10 (e.g., −40° C. to 130° C.) due to linear expansion of the resin constituting the partial moldings 30 and 40. In this case, as shown in FIG. 4, for example, it is sufficient that, after the first gap 26 has been formed, a non-magnetic spacer 50 with a size corresponding to the gap width is inserted into the first gap 26 (spacer inserting step), and then the first partial molding 30 is formed to cover the spacer 50. It is desirable to use a material with a low thermal expansion coefficient to form the spacer 50.

In addition, in such a case, it is desirable to use, in the partial moldings 30 and 40, a resin having a linear expansion coefficient close to that of the material of the core main body 12. For example, when a silicon steel plate having a linear expansion coefficient of about $1.17 \times 10^{-5}$/° C. to $1.2 \times 10^{-5}$/° C. is used in the core main body 12, PPS having a linear expansion coefficient of about $1.7 \times 10^{-5}$/° C. to $2.5 \times 10^{-5}$/° C. can be used as resin for the partial moldings 30 and 40.

With the core 10 of the present invention, when a plurality of gaps, namely the gaps 26 and 28, are formed, the pair of the core pieces 20 and 23 do not come apart since the first gap 26 is formed and then the first partial molding 30 is provided, followed by the formation of the second gap 28 at a position at which the second partial molding 40 is provided. Accordingly, the configuration of the core 10 of the present invention is particularly suitable for a wound core. Applying the present invention to a wound core makes it possible to allow the cross-sectional surfaces 21 and 24 of the core pieces 20 and 23, which are determined by the winding number or winding strength of an electromagnetic steel plate, to have substantially equal areas. Furthermore, when the core pieces 20 and 23 are obtained from the same core main body 12 by cutting the core main body 12, irrespective of the occurrence of the residual stress due to the winding step, the annealing step, the varnish impregnation step, and the like performed on the core, the degrees of looseness of the core pieces 20 and 30 due to the restoring force after the cutting are also substantially the same, and therefore, the cross-sectional surfaces 21 and 24 are favorably opposed to each other when the core pieces 20 and 23 are arranged to face each other with the gaps 26 and 28 being interposed therebetween. Therefore, it is possible to suppress a decrease in magnetic permeability caused by a difference in the cross-sectional area or misalignment of the cross-sectional surfaces, to suppress the variability of magnetic characteristics or magnetic saturation characteristics, and to suppress the influence on the linearity or error rate. The bridge portion 43 also has an effect of insulating the busbar from the core main body 12. It is also possible to maintain even the pair of core pieces 20 and 23 whose shapes are asymmetric due to the positions at which the gaps 26 and 28 are formed, thus making it possible to reduce assembly mistakes.

Figure 5:
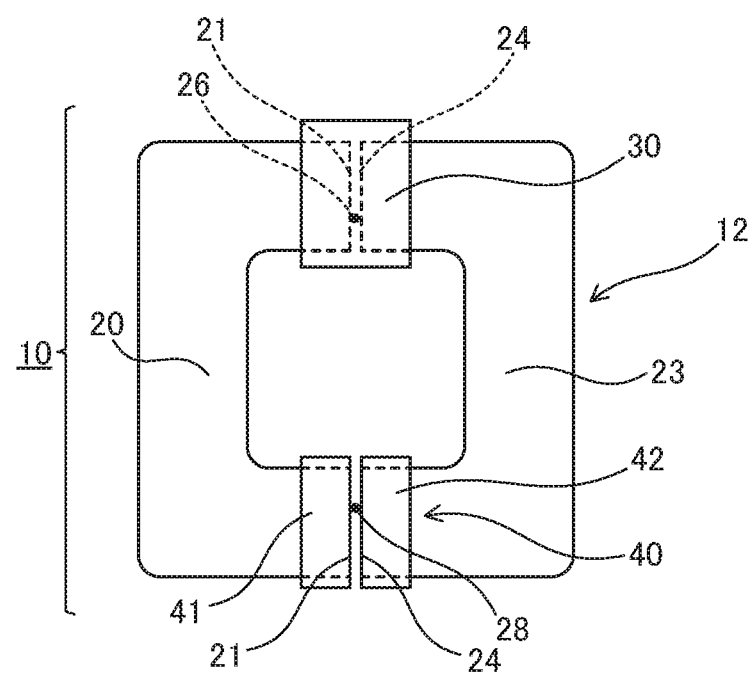
FIG. 5 is a plan view of a core according to another embodiment of the present invention.

Although the bridge portion 43 is left over in the second partial molding 40 when the gap 28 is formed in the above-mentioned embodiment, a configuration as shown in FIG. 5 may also be employed in which the partial molding 40 is completely cut and no bridge portion is left over when the gap 28 is formed. In this case, the second partial molding 40 is divided, but the core pieces 20 and 23 are connected via the first partial molding 30, thus making it possible to maintain the pair of the core pieces 20 and 23.

The foregoing description is intended to illustrate the present invention, and should not be construed as limiting the invention defined in the claims or as restricting the scope of the invention. Also, the configuration of each element of the invention is not limited to the foregoing examples, and various modifications can be made within the technical scope of the claims.

For example, although the gaps 26 and 28 have the same width in the above-mentioned embodiment, they may also have different widths. It is sufficient that the partial moldings 30 and 40 are formed at at least positions at which the gaps 26 and 28 are to be formed, and a partial molding for positioning in a casing or the like of an electric current detector can also be provided additionally.

What is claimed is:

1. A method for manufacturing a core for an electric current detector, comprising:
   - a step of preparing an annular core main body;
   - a first gap forming step including cutting the core main body in a radial direction to form the first gap having two surfaces facing to each other;
   - a first partial mold forming step including covering, with resin, an area near and inclusive of the first gap to form the first partial mold on the core main body;
   - a second partial mold forming step including covering, with resin, an area different from the area of the first mold to form the second partial mold on the core main body; and
   - a second gap forming step including cutting the second partial mold and the core main body in a radial direction to form the second gap having two surfaces facing to each other, such that the core main body is separated into a first core piece and a second core piece that are connected by the first partial mold.

2. The method for manufacturing a core for an electric current detector according to claim 1,
   wherein, in the second gap forming step, the second partial mold is cut leaving a small wall thickness that serves as a bridge portion to maintain a connection of the second partial mold.

3. The method for manufacturing a core for an electric current detector according to claim 1, further comprising
   after the first gap forming step and before the first partial mold forming step, a spacer inserting step of inserting a non-magnetic spacer into the first gap.

4. The method for manufacturing a core for an electric current detector according to claim 2, further comprising
   after the first gap forming step and before the first partial mold forming step, a spacer inserting step of inserting a non-magnetic spacer into the first gap.

* * * * *